United States Patent [19]
Abe

[11] Patent Number: 5,752,846
[45] Date of Patent: May 19, 1998

[54] IC SOCKET

[75] Inventor: Shunji Abe, Yokohama, Japan

[73] Assignee: Yamaichi Electronics Co., Ltd., Tokyo, Japan

[21] Appl. No.: 580,598

[22] Filed: Dec. 29, 1995

[30] Foreign Application Priority Data

Dec. 29, 1994 [JP] Japan .................. 6-339971

[51] Int. Cl.$^6$ .................................... H01R 11/22
[52] U.S. Cl. ............................. 439/266; 439/331
[58] Field of Search ............... 439/70–73, 264–268, 439/330, 331, 525, 526

[56] References Cited

U.S. PATENT DOCUMENTS

| | | |
|---|---|---|
| 5,161,984 | 11/1992 | Taylor et al. |
| 5,249,972 | 10/1993 | Walker . |
| 5,320,550 | 6/1994 | Uratsuji et al. ............. 439/266 |
| 5,354,206 | 10/1994 | Mori .......................... 439/266 X |
| 5,364,284 | 11/1994 | Tohyama et al. .......... 439/266 |
| 5,395,254 | 3/1995 | Mogi .......................... 439/331 X |

FOREIGN PATENT DOCUMENTS 3-289077  12/1991  Japan .

*Primary Examiner*—Khem Nguyen
*Attorney, Agent, or Firm*—Wenderoth, Lind & Ponack

[57] ABSTRACT

An IC socket is provided for obtaining a contact pressure between a contact of a socket body and a lead of an IC package placed on the contact by pressing down an IC package body or the IC lead by an IC presser. The IC socket comprises a cover movably mounted on an upper portion of the socket body for upward and downward movement, and a pressing lever. The pressing lever is axially pivotably supported with respect to the socket body, an external end of the pressing lever being linked to the cover so as to be moved upwardly and downwardly in response to the upward and downward movement of the cover. An internal end of the pressing lever is moved upwardly and downwardly but in opposite directions in response to the upward and downward movement of the cover through a linking portion at the external end of the pressing lever so as to be brought into and out of engagement with an upper surface of the IC body or IC lead, thereby pushing down the IC body or IC lead or releasing the push-down force applied to the IC body or IC lead. The pressing lever is supported such that the pressing lever can slide forwardly and backwardly, and the pressing lever is moved outwardly so as to be spaced away from the IC body and IC lead when the external end of the pressing lever is caused to move downwardly by the downward movement of the cover through the linking portion.

10 Claims, 6 Drawing Sheets

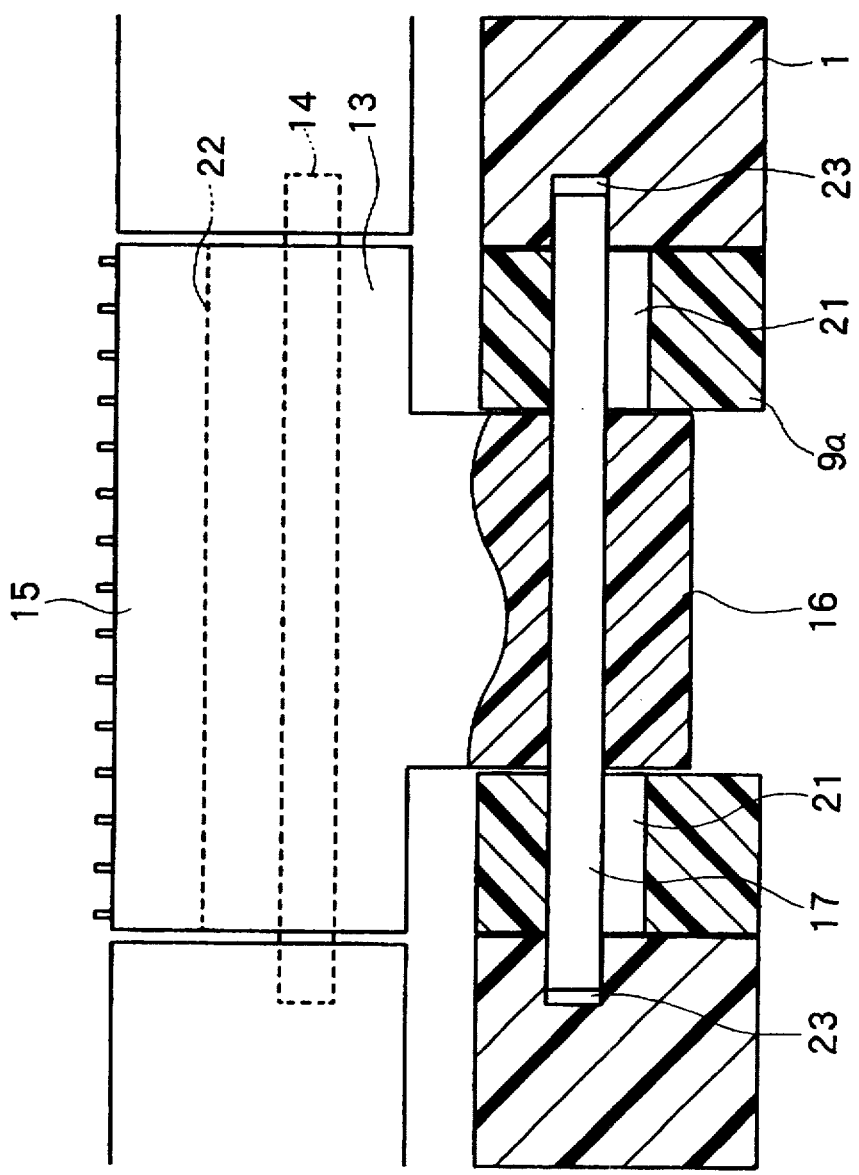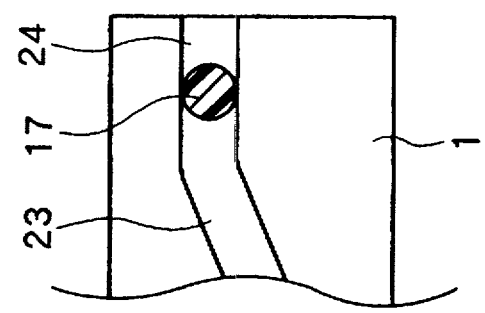

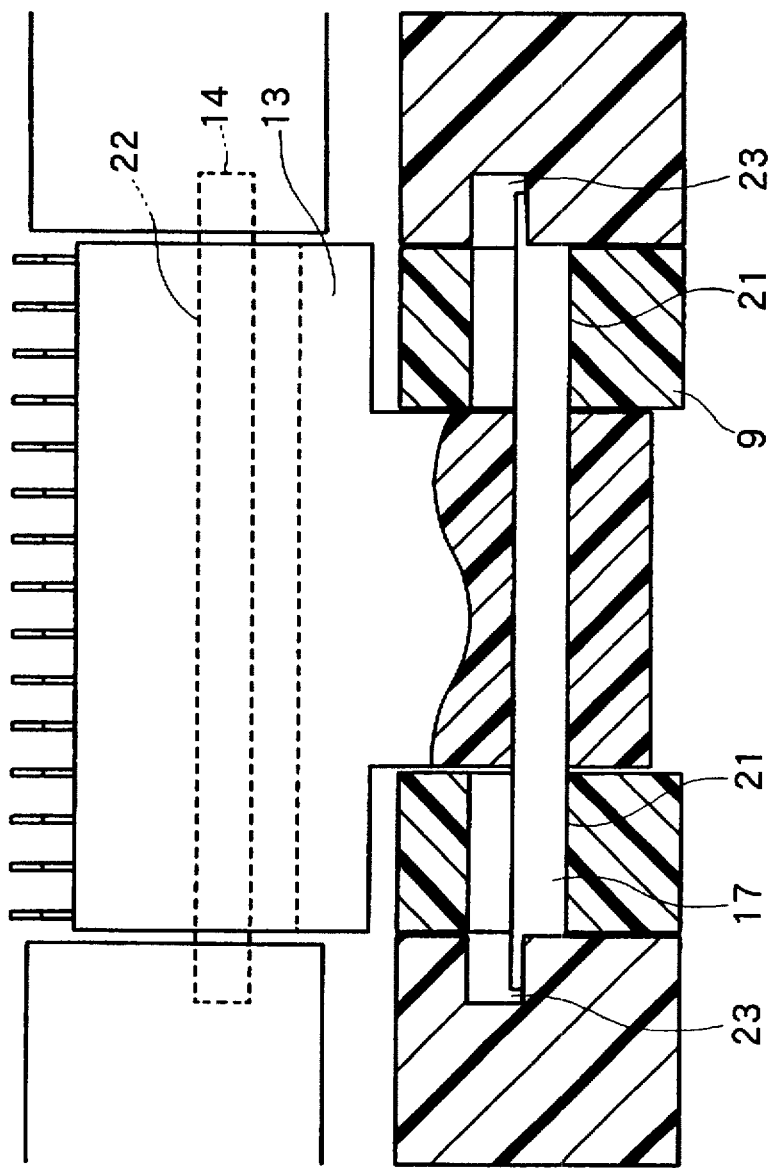
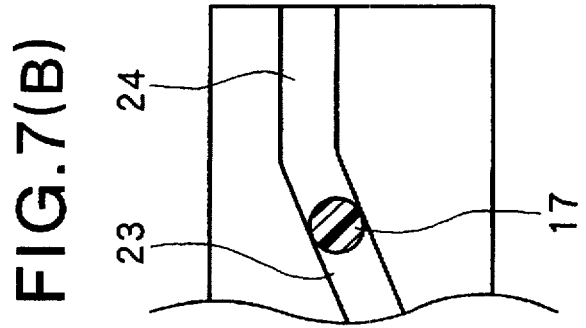

IC SOCKET

BACKGROUND OF THE INVENTION

1. Field of the Invention

The present invention relates to an IC socket which is designed for obtaining a contact pressure between a contact and its corresponding lead by a cover movably mounted on an IC socket for upward and downward movement.

2. Brief Description of the Prior Art

In a Japanese Laid-Open Patent Application No. Hei 3-289077, a first pivotal lever is linked to a cover using a first pivotal lever and a second pivotal lever which is linked to the first pivotal lever, so that the first pivotal lever is pivoted in response to the upward and downward movement of the cover. The pivotal movement of the first pivotal lever causes the second pivotal lever to be pivoted forwardly and backwardly so that the second pivotal lever travels between an engaging position and a disengaging position with respect to an upper surface of an IC body. Then, the IC body is lowered by exerting a downwardly directed force of a spring to the engaging portion, so that the IC body is lowered to urge the IC lead against the contact.

The above conventional device has a complicated construction in which a pair of pivotal levers are linked. Thus, the number of the pivot pins and the linking shafts is increased, and timing is difficult to set. Cumulative errors of the shaft portion makes it difficult to transmit a motion with a high precision, thus resulting in poor engagement.

Since the distance between a pressing-down point made by the cover and an engaging point with respect to the IC body is long, errors of the amounts of motion at the respective points are amplified, thereby making the problem of poor engagement more serious.

The present invention has been accomplished in view of the above problems inherent in the prior art.

SUMMARY OF THE INVENTION

It is, therefore, an object of the present invention to provide an IC socket in which a more reliable electrical connection between a contact and an IC lead can be obtained.

Another object of the present invention is to provide an IC socket which is very simple in construction and small in size.

In order to achieve the above objects, there is provided an IC socket for obtaining a contact pressure between a contact of a socket body and a lead of an IC package placed on the contact by pressing down an IC package body or the IC lead by IC presser means. The IC socket comprises a cover movably mounted on an upper portion of the socket body for upward and downward movement, and a pressing lever. The pressing lever is axially pivotably supported with respect to the socket body, an external end of the pressing lever being linked to the cover so as to be moved upwardly and downwardly in response to the upward and downward movement of the cover. An internal end of the pressing lever is moved upwardly and downwardly but in opposite directions in response to the upward and downward movement of the cover through a linking portion at the external end of the pressing lever so as to be brought into and out of engagement with an upper surface of the IC body or IC lead, thereby pushing down the IC body or IC lead or releasing the push-down force applied to the IC lead. The pressing lever is supported such that the pressing lever can slide forwardly and backwardly, and the pressing lever is moved outwardly so as to be spaced away from the IC body and IC lead when the external end of the pressing lever is caused to move downwardly by the downward movement of the cover through the linking portion.

Since the engagement and disengagement with the IC body or lead are accomplished by a single pressing lever which is linked to the cover, the present invention can achieve the object with a very simple construction.

Further, since the number of pin portions for supporting the pressing lever is minimized, the problems of insufficient accuracy and inadequate engagement attributable to play of the pivot portion can effectively be obviated. In addition, since the overall cover can be slid inwardly (forwardly) or outwardly (backwardly) while moving the external and internal ends of the pressing lever upwardly and downwardly by the vertical upward and downward movement of the pressing cover, the pressing lever can positively be moved away from the IC body or lead by reducing the push-down stroke of the cover as much as possible and retracting the pressing lever a relatively large amount.

The above and other objects, characteristic features and advantages of the present invention will become more apparent to those skilled in the art by the following description of the preferred embodiment of the invention, as illustrated in the accompanying drawings.

BRIEF DESCRIPTION OF THE DRAWING

FIG. 6(A) is a cross-sectional view of a pivotal portion of the pressing lever in the above IC socket, showing the state that the pressing lever is pivoted while proceeding forwardly and inwardly and FIG. 6(B) is a side view of a slanted cam in that state;

FIG. 7(A) is an illustration, showing the state in which the pressing lever is pivoted while proceeding backwardly and outwardly in the cross sectional view of FIG. 6, and FIG. 7(B) is a side view of the slanted cam in that state.

DETAILED DESCRIPTION OF THE EMBODIMENT

Figure 1:
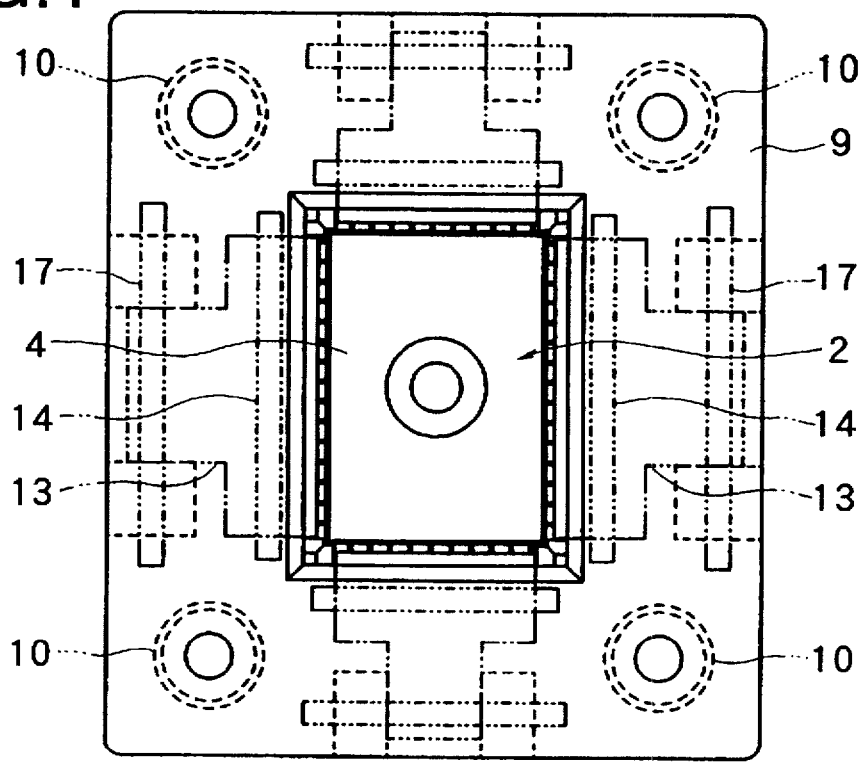
FIG. 1 is a plan view of an IC socket.
Figure 2:
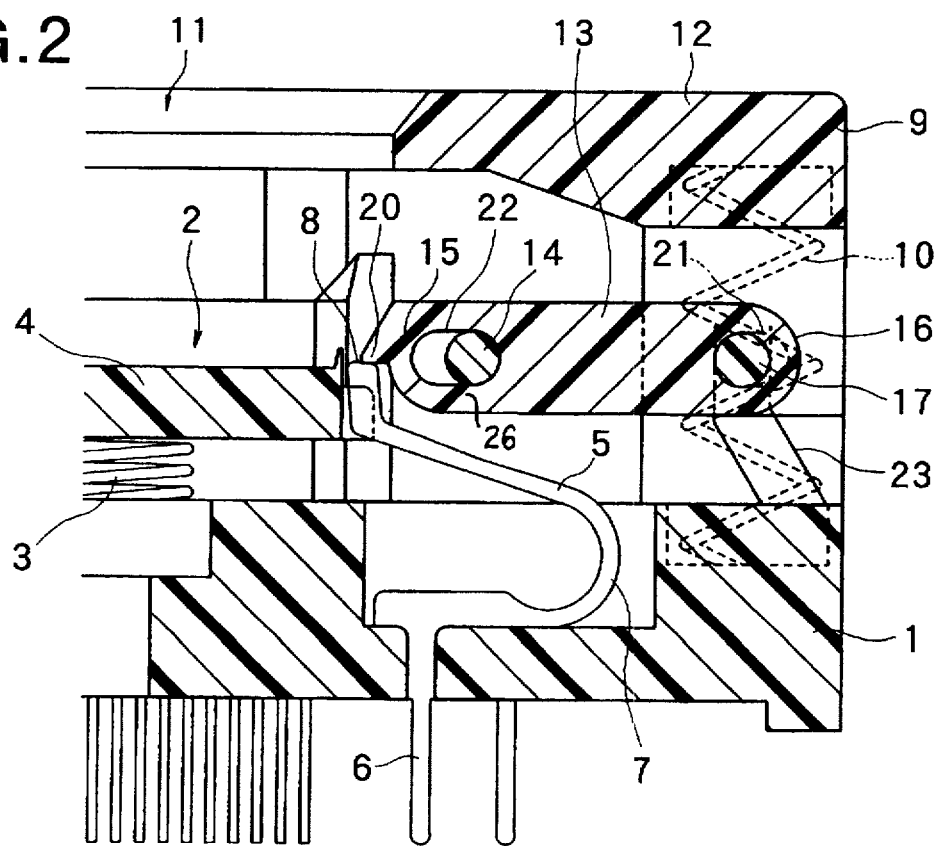
FIG. 2 is a fragmentary sectional view of the IC socket of FIG. 1, showing a normally closed state before an IC package is loaded.

As shown in FIGS. 1 and 2, as well as elsewhere, a socket body 1 has an IC receiving portion 2 which is open at a central portion of an upper surface thereof, and a floating table 4 resiliently movably supported on an inner bottom surface of the IC receiving portion 2 through a spring 3 for movement upwardly and downwardly. The socket body 1 is provided with a plurality of contacts 5 arranged along two or four opposing sides of the floating table 4, i.e., along two or four opposing sides of the IC receiving portion 2.

Depending on the type of IC, the contacts 5 may be arranged along only one side of the IC receiving portion 5. A lower end of each contact 5 is implanted in the socket body 1. The contact 5 includes a male terminal 6 extending downwardly of the socket body 1 from the lower end of the implanted portion of the contact 5 and a spring portion 7 extending from an upper portion of the implanted portion. An upper end of the spring portion 7 is defined as a lead overlie and contact portion 8. A plurality of such lead overlie and contact portions 8 are arranged along each side of the floating table 4.

On the other hand, the socket body 1 is provided on an upper portion thereof with a cover 9. The cover 9 is resiliently held by springs 10 which are interposed between the cover 9 and the socket body 1 at each corner of the socket body 1, for example, such that the cover 9 is pushed upwardly by the resiliency of the springs 10.

The cover 9 has an IC insertion removal window 11 which is open at an upper position of the IC receiving portion 2. A push-down control portion 12 is formed by a frame wall which defines the IC insertion removal window 11.

Pressing levers 13 are disposed, in their horizontal postures, immediately under the frame wall, i.e., push-down control portion 12, of the cover 9. Each pressing lever 13 is pivotally supported at an intermediate (pivot) portion 26 thereof through a support pin 14. The pressing lever 13 has an inner end 15 projecting inwardly from the pivot portion 26 and an external end 16 extending outwardly from the pivot portion 26 by a comparatively long distance. The external end 16 is linked to the frame wall of the cover 9 through a shaft 17.

When the cover 9 is moved down while depressing the spring 10 in the manner as mentioned, the external end 16 of the pressing lever 13 is also pivoted downwardly about the pin 14 through a linking portion 9a and at the same time, the inner end 15 is pivoted upwardly about the pin 14.

When the cover 9 is pushed upwardly by the resilient force of the spring 10, the external end 16 of the pressing lever 13 is also pivoted upwardly about the pin 14 through the linking portion 9a and at the same time, the inner edge 15 is pivoted downwardly about the pin 14.

A lead presser 20 is formed on the inner end 15 of the pressing lever 13. The lead presser 20 is brought into and out of engagement with an upper surface of each IC lead 19. When the lead presser 20 is brought into engagement with the IC lead 19, it pushes down the IC lead 19 against the overlie and contact portion 8 of the contact 5.

The inner end 15 of the pressing lever 13 can be brought into and out of engagement with an edge portion of the upper surface of the IC body 18. When the inner end 15 is brought into engagement with the edge portion of the upper surface of the IC body 18, it pushes down the IC body 18 so that the lead 19 is urged against its corresponding contact 5. At that time, the lead presser 20 acts as a presser of the IC body 18.

The IC package has the leads 19 which are allowed to project sidewardly from side surfaces of the IC body 18. When the IC package is received in the IC receiving portion 2, the IC lead 19 is placed on or proximately faced with the overlie and contact portion 8 of the contact 5.

When the lead presser portion 20 formed on the inner end 15 of the pressing lever 13 is moved downwardly, it pushes down the upper surface of the lead 19 with the overlie and contact portion, and when the lead presser portion 20 is moved upwardly, it is slantwise upwardly and outwardly brought away from the upper surface of the lead 19. In that state, the IC package can be inserted and removed.

As mentioned above, there is provided a means for moving the inner end 15 and the external end 16 of the pressing lever 13 upwardly and downwardly but in mutually opposite directions, and there is also provided a means for sliding the lever 13 inwardly and outwardly.

Figure 5:
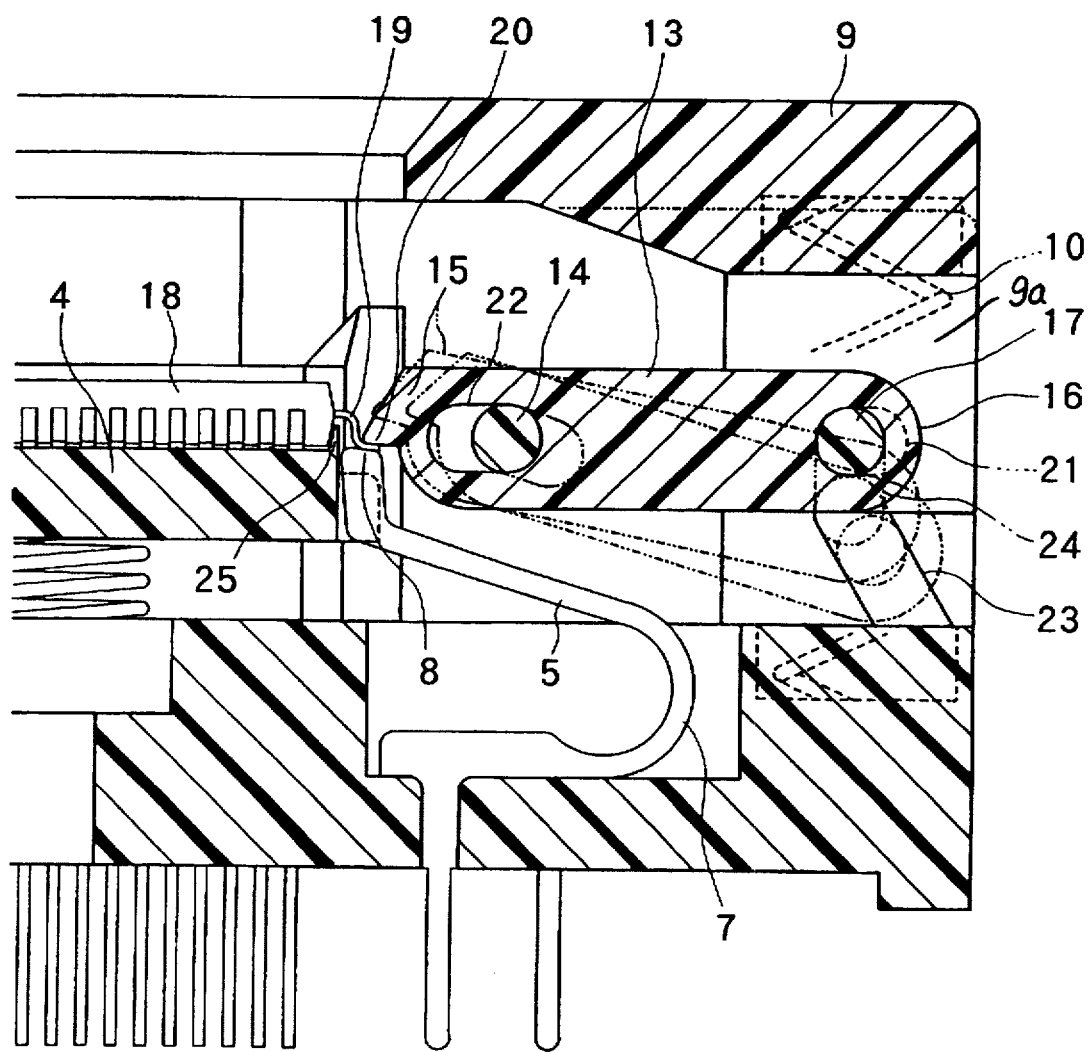
FIG. 5 is a fragmentary sectional view of an IC socket showing the locus of movement of the presser cover when the presser cover is opened in the state of FIG. 4.

As shown in FIGS. 5, 6 and 7, as well as elsewhere, the external portion 16 of the pressing lever 13 and the linking portion 9a of the cover 9 are tightly connected through the shaft 17 so that no play is generated. Opposite ends of the pin 14 serving as the pivot point of the pressing lever 13 are supported by the socket body 1 and the pivot pin 14 is loosely fitted into a guide slot 22, which is comprised of a horizontal elongated hole, formed in the pressing lever 13. That is, the shaft 17 and the pressing lever 13 are laterally moved in unison.

Accordingly, opposite ends of the pin 14 of the pressing lever 13 are supported on the socket body 1, and the pivot pin 14 is loosely fitted into the guide slot 22, which is comprised of a lateral elongated hole, formed in the pressing lever 13.

The pressing lever 13 can laterally be moved inwardly and outwardly within a range permitted by the guide slot 22. The pressing lever 13 is moved by a combined motion of the above-mentioned horizontal motion element and the previously-mentioned pivotal motion element.

As a means for generating a combined motion of the lateral motion and the pivotal motion, there is a provision of a slanted cam 23 for guiding opposite ends of the linking shaft 17.

The slanted cam 23 is disposed on the socket body 1, so that opposite ends of the linking shaft 17 are slip fitted to the slanted cam 23. As a consequence, the shaft 17 is moved downwardly while being retracted outwardly due to the guiding function of the slanted cam 23. The slanted cam 23 employed in this embodiment is, for example, a slanted cam groove which is oriented such that the groove is gradually inclined outwardly toward the lower end. In accordance with necessity, a vertical cam portion 24 may be disposed in such a manner as to be continuous from an upper end of the slanted cam 23.

When the cover 9 is moved downwardly, the linking shaft 17 is guided by the slanted cam 23 via the vertical cam portion 24 so that an externally moving motion is applied to the pressing lever 13.

As shown in FIG. 2, when the cover 9 is held in its raised position by the push-up force of the spring 10, this push-up force of the spring 10 is applied to the linking portion of the cover 9 with respect to the pressing lever 13. As a consequence, the external end 16 of the pressing lever 13 is moved upwardly, and the inner end 15 and the lead presser portion 20 are moved downwardly, so that the lead presser portion 20 is urged against the lead overlie and contact portion 8 under the biasing force of the spring 10.

Figure 3:
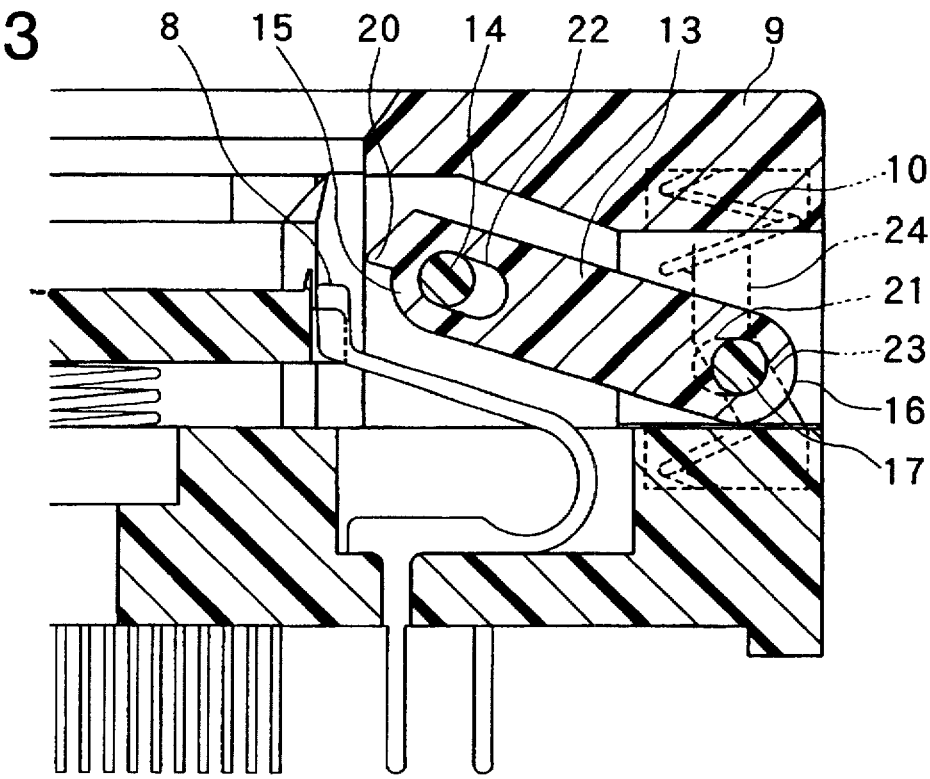
FIG. 3 is likewise a fragmentary sectional view of the IC socket but in which a presser cover is open.
Figure 8:
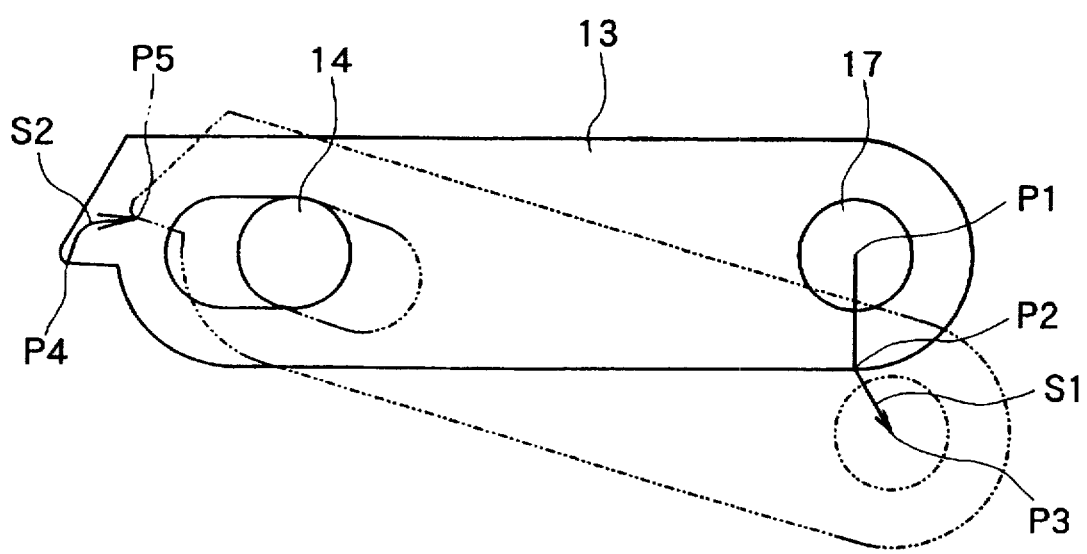
FIG. 8 is an explanatory view for explaining the locus of movement of the external and internal ends of the presser cover.

Next, when the cover 9 is pressed downwardly, as shown in FIGS. 3 and 8, the external end 16 of the pressing lever 13 linked to the cover 9 is moved downwardly with the support shaft 14 serving as a support point. At the same time, the lead presser portion 20 of the inner end 15 is moved upwardly and away from the overlie and contact portion 8 in a slantwise manner.

Simultaneous with the pivotal motion of the pressing lever 13, the linking shaft 17 is guided by the slanted cam 23 to track the external end 16 of the pressing lever 13 outwardly (backwardly) in accordance with the angle of inclination, so that an external lateral motion is applied to the pressing lever 13 integral with the shaft 17 while guiding the pressing lever 13 through first and second guide slots 21, 22. As a consequence, the lead presser portion 20 of the pressing lever 13 is positively moved away from the lead 19.

A sufficiently large amount of external lateral motion can be applied to the pressing lever 13 with a limited small amount of downward motion of the presser cover 9 caused by the lateral motion. By this, the lead presser portion 20 can positively be moved away from the lead 8.

Figure 4:
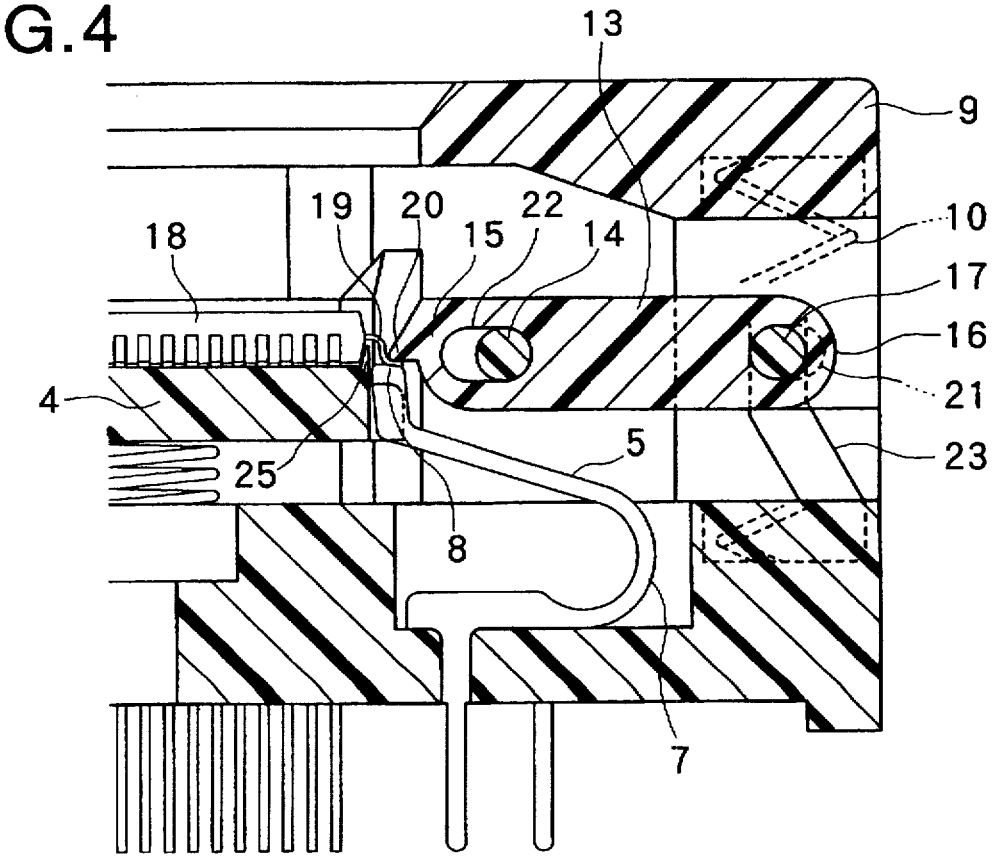
FIG. 4 is a fragmentary sectional view of the IC socket, in which an IC package is loaded on the IC socket in the state of FIG. 3, and then the presser cover is closed to press an IC lead toward its corresponding contact.

As shown in FIG. 4, after the lead presser portion 20 is retracted to a sufficient extent, the IC package is inserted into the IC receiving portion 2 and correctly positioned, with the side surface of the IC body 18 restricted by positioning wall 25 on the peripheral edge portion of the floating table 4 and with the lower surface of the IC lead 19 overlaid and contacted with or located proximate to the upper surface of the overlie and contact portion of the contact 5.

Next, when the push-down force applied to the cover 9 is removed, the cover 9 is pushed upwardly by the resilient restoring force of the spring 10. This upward force of the cover 9 is applied to the linking portion, so that the external end 16 of the presser cover 13 is applied with an upward motion through this linking portion. At the same time, the linking shaft 17 is raised while being guided by the slanted cam 23. Then, the external end 16 of the pressing lever 13 integral with the shaft 17 is pushed inwardly so that the overall pressing lever 13 is laterally moved forwardly while being guided by the first and second guide slots 21, 22.

As a consequence, the lead presser portion 20 of the pressing lever 13 applies an engaging push-down force to the upper surface of the IC lead 19 through a combined motion of the pivotal motion and the lateral motion, so that the IC lead 19 is urged against the lead overlie and contact portion 8 of the contact 5 by this push-down force.

As a result, the lead overlie and contact portion 8 is flexed downwardly against the resiliency of the spring portion 7, and caused to contact, under pressure, the lead 19 by reaction of the spring portion 7. As described above, the present invention includes the case that the inner end of the presser cover 13 is brought into engagement with the edge portion of the upper surface of the IC body 18.

In the state of FIG. 5, when the cover 9 is lowered again, the lead presser portion 20 of the pressing lever 13 is moved upwardly and away from the lead 19 to remove the electrical connection between the contact and the lead as described with reference to FIG. 3.

As described above, the single pressing lever is used and this lever is operatively connected to the cover 9 for movement upon upward and downward movement of the cover, so that the IC lead is pressed into and released from engagement.

As shown in FIG. 8, the linking shaft 17 of the external end of the pressing lever 13 is vertically moved from a point $P_1$ to a $P_2$ along the locus $S_1$. On the other hand, the lead presser portion 20 of the inner end 15 of the pressing lever 13 is pivotally moved slantwise upwardly between points $P_4$ and $P_5$ along the locus $S_2$.

The pressing lever 13 is operatively connected to the cover 9 through the linking shaft 17 and supported by the socket body 1 through the pivot pin 14.

In that case, it is possible that the first guide slot 21 is provided at the external end 16 of the pressing lever 13 and the linking shaft 17 is provided on the cover 9. It is also possible that the second guide slot 22 is provided at the socket body 1 and the pivot pin 14 is provided on the pressing lever 13.

As shown in FIG. 1, the pressing lever 13 is disposed along the edge portion of each opposing side of the IC receiving portion, so that the pressing levers 13 are placed opposite the contacts 5 which are arranged along the four sides, two sides or one side of the IC receiving portion.

The pressing lever is integrally formed of an insulative material or formed of a metal material, and the pressing surface of the lead presser portion 20 is attached with an insulative material.

The present invention can form a structure for obtaining a contact pressure by urging the IC lead against its corresponding contact utilizing the single pressing lever which is linked to the cover. Thus, the present invention can achieve its object by remarkably simplifying the construction of the IC socket compared with the construction of the conventional double link structure.

Further, since the present invention employs the single pressing lever system, the number of the pivot points is minimized so that errors caused by play of the pivot point can be reduced as much as possible. Owing to this arrangement, the pressing lever can reliably be brought into and out of engagement with the upper surface of the IC body or IC lead.

Moreover, the distance between the press-down point of the pressing lever by the cover and the engaging points with respect to the IC body or IC lead are extensively reduced, so that motion errors of the opposite ends of the pressing lever can be minimized.

Furthermore, by operatively connecting the pressing lever to the cover such that the overall lever is slid backwardly while moving the external and internal ends of the pressing lever upwardly and downwardly, the pressing lever can be retracted over a relatively large distance with the minimum possible press-down stroke of the cover, so that the lever can reliably be moved away from the IC body or lead.

It is to be understood that the form of the invention herewith shown and described is to be taken as the preferred embodiment of the same, and that various changes in the shape, size and arrangement of parts may be resorted to without departing from the spirit of the invention or the scope of the subjoined claims.

What is claimed is:

1. An IC socket for receiving an IC package, said IC socket comprising:

a socket body including an IC receiving portion and contacts, respectively having contact portions, disposed about said IC receiving portion;

a cover movably mounted to said socket body for movement downwardly toward and upwardly away therefrom;

a presser lever having an inner end and an outer end, said inner end of said presser lever being non-movably attached to said outer end of said presser lever;

wherein said inner end of said presser lever includes an IC presser portion and is pivotally and slidably mounted, by a pivot pin-and-slot connection, to said socket body; and wherein said outer end of said presser lever is pivotally mounted, by a pivot shaft, to said cover for movement therewith relative to said socket body such that, upon movement of said cover downwardly toward said socket body, said outer end of said presser lever is moved downwardly and outwardly and said inner end of said presser lever is pivoted upwardly about said pivot pin-and-slot connection and moved outwardly away from said contact portions of said contacts and said IC receiving portion of said socket body.

2. An IC socket as recited in claim 1, wherein a cam slot is formed in said socket body, and said pivot shaft is slidably received in said cam slot.

3. An IC socket as recited in claim 2, wherein said cam slot is inclined in a direction downwardly and outwardly such that, when said outer end of said presser lever is moved downwardly, said pivot shaft is slid downwardly and outwardly in said cam slot.

4. An IC socket as recited in claim 1, further comprising a spring for biasing said IC presser portion of said presser lever against said contact portions of said contacts.

5. An IC socket as recited in claim 1, further comprising a spring interposed between said socket body and said cover and urging said cover, and said outer end of said presser lever, upwardly.

6. An IC socket as recited in claim 1, wherein an inwardly-and-outwardly elongated hole is formed in said cover, and said pivot shaft is slidably received in said elongated hole.

7. An IC socket for receiving an IC package, said IC socket comprising:

a socket body including an IC receiving portion and contacts, respectively having contact portions, disposed about said IC receiving portion;

a cover movably mounted to said socket body for movement downwardly toward and upwardly away therefrom;

a presser lever having an inner end and an outer end;

wherein said inner end of said presser lever includes an IC presser portion and is pivotally and slidably mounted, by a pivot pin-and-slot connection, to said socket body;

wherein said socket body has a downwardly and outwardly inclined cam slot formed therein; and wherein said outer end of said presser lever is pivotally mounted, by a pivot shaft, to said cover for movement therewith relative to said socket body, and said pivot shaft is slidably mounted in said cam slot, such that, upon movement of said cover downwardly toward said socket body, said pivot shaft and said outer end of said presser lever are moved downwardly and outwardly and said inner end of said presser lever is pivoted upwardly about said pivot pin-and-slot connection and moved outwardly away from said contact portions of said contacts and said IC receiving portion of said socket body.

8. An IC socket as recited in claim 7, further comprising a spring for biasing said IC presser portion of said presser lever against said contact portions of said contacts.

9. An IC socket as recited in claim 7, further comprising a spring interposed between said socket body and said cover and urging said cover, and said outer end of said presser lever, upwardly.

10. An IC socket as recited in claim 7, wherein an inwardly-and-outwardly elongated hole is formed in said cover, and said pivot shaft is slidably received in said elongated hole.

* * * * *